United States Patent
Ohmi et al.

(10) Patent No.: US 6,958,094 B2
(45) Date of Patent: Oct. 25, 2005

(54) SINGLE CRYSTAL CUTTING METHOD

(75) Inventors: Tadahiro Ohmi, Miyagi (JP); Shigetoshi Sugawa, Miyagi (JP); Toshikuni Shinohara, Miyagi (JP); Tatsuo Ito, Gunma (JP); Koichi Kanaya, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 309 days.

(21) Appl. No.: 10/332,433

(22) PCT Filed: Jul. 6, 2001

(86) PCT No.: PCT/JP01/05891

§ 371 (c)(1),
(2), (4) Date: Jan. 8, 2003

(87) PCT Pub. No.: WO02/11194

PCT Pub. Date: Feb. 7, 2002

(65) Prior Publication Data

US 2003/0155335 A1 Aug. 21, 2003

(30) Foreign Application Priority Data

Jul. 11, 2000 (JP) .................................. 2000-210192

(51) Int. Cl.⁷ .......................... C30B 25/12; C30B 25/14
(52) U.S. Cl. ........................................ 117/92; 117/103
(58) Field of Search ................................ 117/92, 103

(56) References Cited

FOREIGN PATENT DOCUMENTS

| JP | 62-226891 | 10/1987 |
| JP | 01-273687 | 11/1989 |
| JP | 05-299500 | 11/1993 |
| JP | 09-141645 | 6/1997 |
| JP | 11-347758 | 12/1999 |

OTHER PUBLICATIONS

2000 Symposium on VLSI Technology, Honolulu, Hawaii, Jun. 13th–15th, 200 "Advantage of Radical Oxidation for Improving Reliability of Ultra–Thin Gate Oxide".

Primary Examiner—Felisa Hiteshew
(74) Attorney, Agent, or Firm—Hogan & Hartson, LLP

(57) ABSTRACT

The present invention provides a method for slicing a single crystal, wherein the single crystal is sliced by irradiating a portion to be sliced with an ultra short pulse laser beam while supplying a gas containing gaseous molecules or radicals that react with atoms constituting the single crystal to become stable gaseous molecules in the vicinity of the portion under slicing. Thus, there is provided a method for slicing a single crystal by using a laser processing, in which a single crystal is processed while obtaining a good sliced surface and markedly reducing a slicing loss.

12 Claims, 2 Drawing Sheets

SINGLE CRYSTAL CUTTING METHOD

TECHNICAL FIELD

The present invention relates to a method for slicing a single crystal by using a laser, which can markedly reduce slicing loss and thereby enables effective use of the single crystal.

BACKGROUND ART

Single crystal wafers, of which typical examples are those of silicon (Si) and gallium arsenide (GaAs), are obtained by slicing a single crystal ingot produced by the Czochralski method (CZ method) or the floating zone method (FZ method) into wafers. Therefore, it is desired to obtain wafers as many as possible from one ingot by making thickness of wafer as small as possible or reducing the stock removal for slicing. That is, desirability of reducing thickness of wafers or processing loss in the production of wafers to reduce waste of the raw material and thereby reduce production cost of wafers has hitherto been widely recognized.

For example, as an apparatus for slicing silicon wafers from a silicon single crystal ingot, a wire saw and inner diameter slicer are most generally used. However, since stock removal for slicing is required when silicon wafers are sliced by using these apparatuses, there are generated loss of the raw material. Even using a wire saw, which generates comparatively little slicing loss, slicing loss for about 200 μm per wafer is unavoidable. Further, the slicing by a wire saw, inner diameter slicer or the like leaves a damaged layer at a sliced surface after the slicing. Therefore, lapping, etching and so forth for removing the damaged layer are required, and they also generate loss of raw material. Furthermore, in such a mechanical processing, if a wafer is sliced with an unduly small thickness from the raw material ingot, it becomes likely that the wafer breaks during the processing. Therefore, a wafer must be sliced with a thickness larger than required and then processed to have a desired thickness by performing back lapping or back grinding after devices are finally produced. Therefore, a significant portion of the expensive single crystal material is wasted vainly.

Meanwhile, it has been also contemplated that the slicing of a single crystal is attained by laser processing, which is widely used for welding and cutting in the other fields. Laser processing generally provides higher precision compared with conventional mechanical processing and therefore it has advantages that precise processing is possible and waste of the raw material is little. However, the laser processing has a problem concerning melting due to evolution of heat or the like, and thus it suffers from disadvantages that peripheral portions under slicing are degraded and processing traces are remained. Therefore, it has been difficult to apply the laser processing to the semiconductor processing, which requires processing precision less than micrometer order.

To solve this problem, there has been advancing development of ultra short pulse lasers that can be employed for slicing of semiconductor single crystals. If the processing is performed by using an ultra short pulse of a pulse length of about several tens femtoseconds, excitation time is shortened to the same level as the relaxation time of atomic vibration, and bonds between atoms themselves can be cut without generating heat. Therefore, unlike the melting by evolution of heat, it does not cause degradation of peripheral portions under slicing and processing traces, and it may enables high precision processing of only the irradiated portion. Furthermore, if a short wavelength laser such as an excimer laser is used, photon energy is equal to the energy required to cut atomic bonds, and thus high quantum probability can be obtained. Therefore, high-speed and high efficiency processing becomes possible. At the same time, since a laser compressed into an ultra short pulse have an extremely large maximum power of the pulse, more effective processing is realized by nonlinear optic effects such as two-photon absorption.

However, a slicing method utilizing such an ultra short pulse laser has problems, for example, atomic substances removed by the laser slicing reattach t o the processed surface and so forth, flatness of the sliced surface cannot be obtained and thus processed form is degraded. Therefore, even if a laser slicing method utilizing an excimer laser or the like is applied as it is to the slicing of a single crystal such as a silicon single crystal, the advantage of the laser slicing that high speed and high efficiency processing is possible cannot be utilized effectively, and thus yield of the slicing of a single crystal cannot be improved compared with mechanical processing using a wire saw or inner diameter slicer.

DISCLOSURE OF THE INVENTION

Therefore, the major object of the present invention is to provide a method for slicing a single crystal by using a laser, in which a single crystal is sliced while obtaining a good sliced surface and markedly reducing slicing loss.

The present invention, which achieves the aforementioned object, provides a method for slicing a single crystal, wherein the single crystal is sliced by irradiating a portion to be sliced with an ultra short pulse laser beam while supplying a gas containing gaseous molecules or radicals that react with atoms constituting the single crystal to become stable gaseous molecules in the vicinity of the portion under slicing.

By irradiating a portion to be sliced with an ultra short pulse laser beam and simultaneously supplying a gas containing gaseous molecules or radicals that react with atoms constituting the single crystal to become stable gaseous molecules in the vicinity of the portion under slicing as described above, atomic substances produced by the processing for slicing can be discharged as stable gaseous atoms. Therefore, a single crystal can be sliced without the problems that atomic substances removed by the ultra short pulse laser slicing reattach to the processed surface and so forth, flatness of the sliced surface cannot be obtained and thus processed form is degraded. Thus, a single crystal can be sliced by utilizing the advantages of the ultra short pulse laser slicing that it generates little waste and enables high speed and high efficiency processing.

In the aforementioned method, the ultra short pulse laser beam is preferably an excimer laser.

If an excimer laser is used as described above, a single crystal can be sliced without leaving degradation due to melting and processing traces around the sliced portion. Further, since photon energy is equal to the energy required to cut atomic bonds, high quantum probability can be obtained, and therefore high speed and high efficiency processing becomes possible.

In the aforementioned method, the aforementioned ultra short pulse laser is preferably a mode-locking type Q-switched laser.

If the ultra short pulse laser is a mode-locking type Q-switched laser as described above, ultra short pulses can be obtained in a continuous excited state with energy supply of low level when ultra short pulses are formed, and thus the energy consumption upon the single crystal slicing can be reduced.

In the aforementioned method, the radicals can be hydrogen radicals.

If hydrogen radicals are used as described above, they can be easily obtained as radicals by using a catalyst, they can be easily handled, and atomic substances generated upon slicing can be efficiently removed.

In the aforementioned method, concentration of the hydrogen radicals in the gas is preferably 10% or less.

If the hydrogen radicals are supplied in a state that the radicals are diluted to a concentration of 10% or less in the gas as described above, the lifetime of the radicals can be prolonged as long as possible. The concentration is more preferably 0.1 to 5%.

In the aforementioned method, the single crystal may be a silicon.

If the single crystal wafers consist of semiconductor silicon as described above, the effect of the reduction of cost becomes extremely significant, since semiconductor silicon is the most widely used semiconductor at present.

In the aforementioned method, stock removal for slicing can be 5 $\mu$m or less.

The slicing method of the present invention enables the slicing of a single crystal with high precision and good sliced surface by using laser processing. Therefore, the stock removal for slicing can be made extremely smaller compared with conventional techniques.

In the aforementioned method, the single crystal wafer can be sliced from the single crystal so that the single crystal wafer should satisfy a relationship of thickness of single crystal wafer ($\mu$m)/diameter of single crystal wafer (mm); $\leq 3$.

Since the slicing method of the present invention enables slicing of a single crystal with high precision and good sliced surface by using laser processing, it enables slicing of such an extremely thin wafer that it should satisfy the relationship of thickness of single crystal wafer ($\mu$m)/diameter of single crystal wafer (mm)$\leq 3$ as described above.

In the aforementioned method, the single crystal wafer is preferably sliced from the single crystal so that the main surface of the single crystal wafer has a plane or a plane equivalent to a plane tilting with respect to a [100] axis of the single crystal by angles of $\alpha$ ($0°<\alpha<90°$) for the [011] direction, $\beta$ ($0°<\beta<90°$) for the [01-1] direction and $\gamma$ ($0°\leq\gamma<45°$) for the [10-1] or [101] direction.

This characteristic is adopted because a technique was recently developed for forming an insulator film of good quality irrespective of the plane orientation of silicon wafer surface (refer to 2000 Symposium on VLSI Technology, Honolulu, Hi., June 13th–15th, 2000 "Advantage of Radical Oxidation for Improving Reliability of Ultra-Thin Gate Oxide"), and thus it became unnecessary to limit the plane orientation of wafer for the production of semiconductor devices to the conventional {100} plane. Therefore, if a single crystal wafer is sliced from a single crystal so that the wafer should have such a plane orientation as defined above, the main surface of such a single crystal wafer tilts with respect to all the {110} planes, which serve as cleavage planes, the wafer becomes more unlikely to suffer from breakage even if the wafer is sliced with a small thickness. Therefore, if a wafer is sliced by the method of the present invention so that the wafer should have such a plane, not only the slicing loss is reduced, but also the produced thin wafer is unlikely to suffer from breakage and can be sufficiently used for practical use such as device production process. In addition, since the slicing method of the present invention is a method independent from the plane orientation of single crystal, flattening processing of a wafer is possible at an atomic order, even if the wafer is sliced along such a plane.

As described above, according to the method for slicing a single crystal of the present invention, a thin silicon wafer that is unlikely to suffer from breakage can be sliced from an ingot without waste and with good flatness by irradiating an ultra short pulse laser light to perform processing of cutting atomic bonds and simultaneously supplying, into the processing atmosphere, gaseous molecules or radicals that form stable gaseous molecules with atoms constituting the material to be processed to prevent reattachment of the material.

BEST MODE FOR CARRYING OUT THE INVENTION

Figure 1:
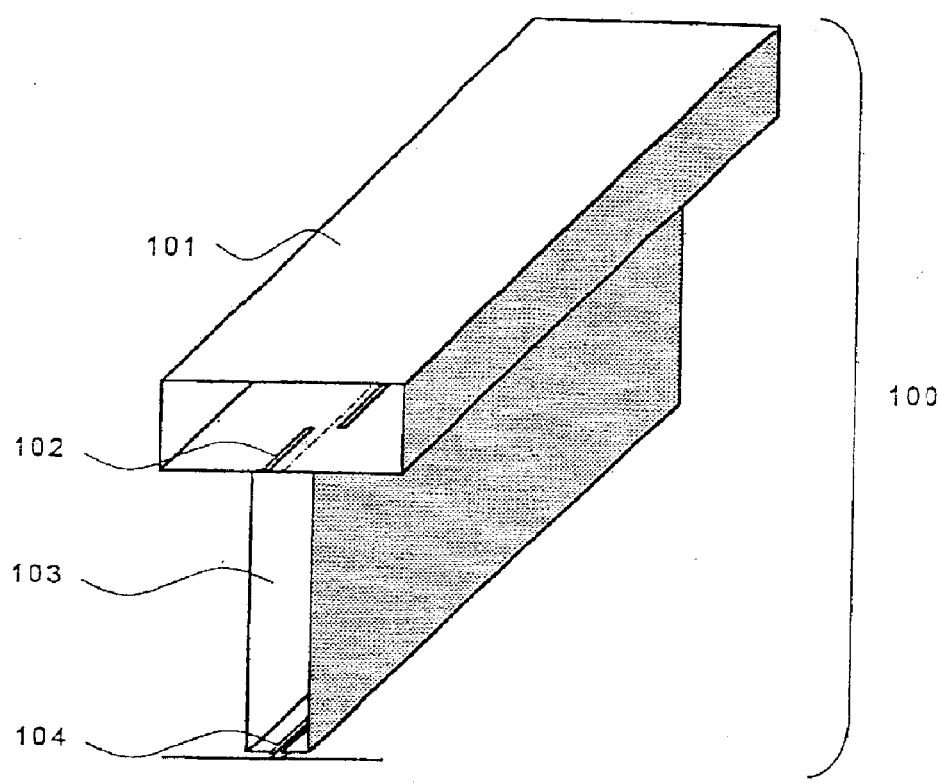
FIG. 1 is a conceptual diagram of an in-phase single slit irradiation apparatus using an H-plane antenna provided with an equalization mechanism.

Hereafter, embodiments of the present invention will be explained in detail.

The inventors of the present invention conducted researches for a method that enables efficient utilization of a single crystal by slicing thin wafers from a single crystal such as a silicon single crystal with high precision and high efficiency. As described above, if a single crystal is sliced by using an ultra short pulse laser such as an excimer laser, atomic bonds themselves in the single crystal can be cut, and therefore processing only at the irradiated portion is possible with high precision. However, such laser processing has a problem that the removed atomic substances attach to the processed surface and the flatness of the processed surface is degraded.

Therefore, the inventors of the present invention conceived supplying a gas containing gaseous molecules or radicals that react with atomic substances removed by the processing to become stable gaseous molecules in the vicinity of a portion under slicing upon slicing of a single crystal by irradiation of an ultra short pulse laser light on the portion to be sliced so that the substances removed by the processing should be converted into stable gaseous molecules so as to prevent the removed substances from attaching to the processed surface.

By doing as described above, the atomic substances removed from the sliced surface by the laser processing can be prevented from reattaching to the sliced surface in a simple manner. Specifically, when a silicon single crystal is sliced, for example, a gas containing hydrogen radicals is supplied to the surface under slicing as an assistant gas, and an excimer laser light is irradiated on a portion to be sliced to slice the single crystal. If Si-Si bonds are cut by an ultra short pulse laser, unnecessary atomic Si is released, and this Si reacts with a hydrogen radical and becomes an inactive $SiH_4$ gas. Then, if this $SiH_4$ gas is discharged, the slicing can be performed efficiently with leaving a good sliced surface.

The present invention was accomplished based on such basic concepts with investigation of various conditions.

Hereafter, the present invention will be further explained with reference to the appended drawings. However, the present invention is not limited by these explanations.

In the present invention, an ultra short pulse laser is used for slicing a thin silicon wafer that is unlikely to break from a silicon single crystal ingot. In such an embodiment, irradiation of an ultra short pulse laser light is performed by using a mode-locking type Q-switch excimer laser in a continuous excitation state using a nonlinear-optical device. The lifetime of excimer is generally extremely short, i.e., as short as nsec order, and for example, it is about 6 nsec for KrF excimer. Therefore, in order to obtain operation as an effective Q-switched laser, resonator length is set to be about 1.5 m or less. Since this can make the time required for one pass of the laser to be about 5 nsec or less, Q-switch operation can be efficiently obtained even in an excimer laser having an extremely short lifetime. That is, by designing a resonator having a scanning time comparable to the lifetime of excimer, an excimer laser can be efficiently excited, which is usually unsuitable as a Q-switched laser.

Continuous excitation of conventionally used DC pulse excitation type excimer requires electric power supply of gigawatt order, and hence it is unsuitable for ultra short pulse formation. In order to avoid this, Q of the resonator of laser is increased, and continuously excited plasma of microwave excitation type is used. In order to increase Q of the laser, reflectance of the output mirror is set at about 100% of reflectance. This enables reduction of gain required for one pass. Further, at the same time, an emission cross sectional area of about 1 $mm^2$ to 10 $mm^2$ can be used to obtain extremely high saturation intensity of, for example, 1.3 $MW/cm^2$, which is required for excitation of KrF excimer laser, in a continuously excited state with low energy supply. In the conventional excitation methods utilizing electrodes, discharge becomes instable or uneven due to the use of small volume. However, by performing the excitation with microwaves, it becomes possible to obtain stable and uniform excitation. Further, in order to efficiently perform the microwave excitation, localization of excitation due to standing waves needs to be suppressed. By using the in-phase single slit irradiation apparatus using an H-plane antenna provided with an equalization mechanism mentioned in this embodiment, uniform excitation can be attained, and securing of the gain length of laser and high excitation efficiency can be collaterally obtained.

A structure for irradiation of the in-phase single slit irradiation apparatus 100 using an H-plane antenna provided with an equalization mechanism is shown in FIG. 1. Microwaves supplied to the H-plane antenna 101 are supplied to the equalization mechanism 103 via slot arrays 102. In this apparatus, by installing the slot arrays 102 on right and left of the center of the H-plane antenna 101 with a distance of a half-wavelength pitch of the guide wavelength, the microwaves discharged from all the slots 102 can be made equiphase. The microwaves discharged in phase from the slot arrays 102 are equalized by the equalization mechanism 103, and uniform discharge of microwaves is attained by a single slot 104. In addition, depending on the discharge form, a horn antenna or the like may be used in order to realize uniform microwave discharge.

By introducing a supersaturation absorber into the resonator utilizing this excitation method, a mode-locking Q-switched laser of an excimer laser is realized. Since the mode-locking method utilizes passive mode locking, it is possible to easily obtain an ultra short pulse light near a Fourier-transformation limit (about 80 fsec for KrF). By using such a structure of the apparatus, it becomes possible to obtain an excimer laser (high energy photons) of high repetition (sub-GHz repetition frequency), ultra short pulse (from psec to fsec order) and high power pulse (from gigawatt to terawatt order).

Figure 2:
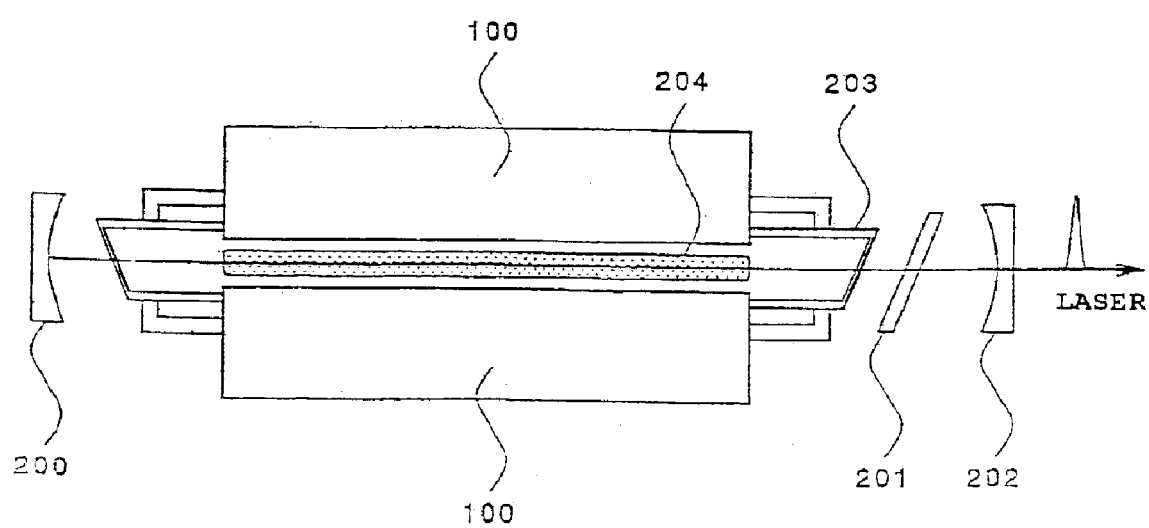
FIG. 2 is a conceptual diagram of a femtosecond excimer laser oscillator.

A further detailed structure of the apparatus is shown in FIG. 2. Plasma 204 is excited by the in-phase single slit irradiation method utilizing the H-plane antennas provided with equalization mechanism disposed below and above. Moreover, reflectors 200 and 202 (depicted as reflecting mirrors) showing complete reflection or reflection near complete reflection are disposed, and then a supersaturation absorber 201 is introduced into the resonator. By using such a structure of the apparatus, a mode-locking Q-switched laser of an excimer laser is realized. In addition, although use of a reflecting mirror as the reflector is desirable in order to secure stability (Xecl, KrF, ArF lasers), a laser resonator showing a high Q may be realized by using a total reflection prism, for example, when a high reflectance mirror is not available ($F_2$ laser)

Figure 3:
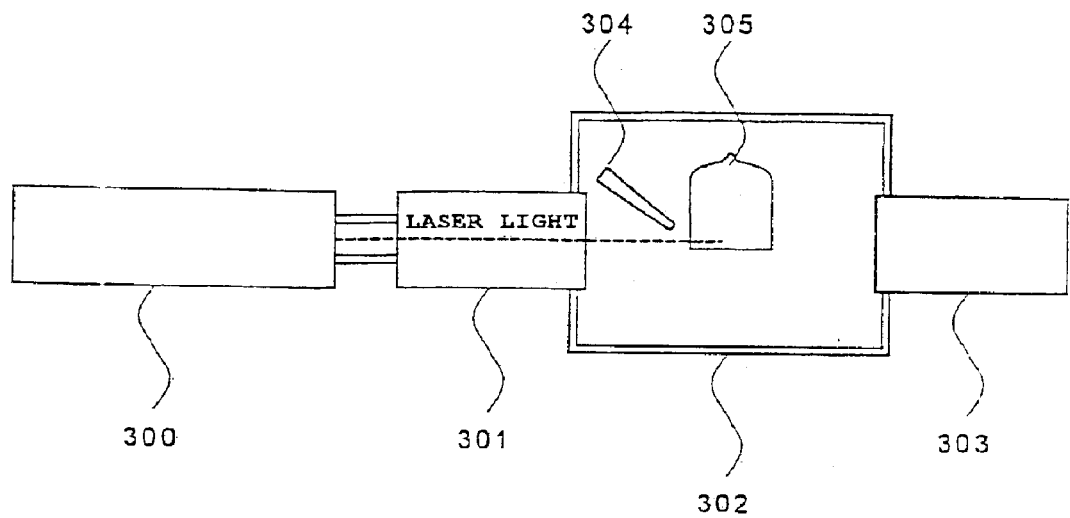
FIG. 3 shows a schematic structure of a laser processing apparatus utilizing a femtosecond excimer laser.

By using the laser obtained as described above, the processing of a silicon wafer is performed as shown in FIG. 3. The beam shape of the laser used for the processing is a dot shape or line shape. This beam shape is adjusted by using a optical fucusing system 301 installed after the output of the laser oscillator 300. The diameter or width of the beam is controlled to be less than about 10 times of the wavelength. That is, in the case of KrF laser, for example, they are adjusted to be about 3 $\mu$m or less. Therefore, realizable processing diameter or width are about 5 $\mu$m, and thus processing generating little waste becomes possible. In addition, high purity $CaF_2$ or the like in which concentrations of heavy metals and so forth are completely controlled is utilized for the lenses used for this optical system. Further, damages of lenses, mirrors and so forth are of course more reduced as the condensation of the beam is made as nearer the final stage (laser output side) as possible. Furthermore, a terminal optical system 303 is disposed on the secondary side of the object of the processing. In the terminal optical system 303, a mirror of high flatness is disposed, and the transmitting laser light is obliquely entered with a small angle, diffused so that the energy density should be reduced, and then introduced into the absorber for termination. Further, a scheme in which the scattering and absorption of the laser light is attained by entering the laser light into water containing a dye or the like may also be used.

In order to prevent burning due to oxygen and so forth, the atmosphere for the processing, i.e., atmosphere in a processing chamber 302 should consist of a highly clean inactive gas such as Ar or $N_2$. The slicing method of the present invention performed in this apparatus is characterized by supplying a gas added with hydrogen from a nozzle 304 in order to attain high speed processing and a flat surface of atomic order. By converting the hydrogen into radicals, allowing the hydrogen radicals to react with atomic substances generated by the processing for slicing and discharging them as inactive $SiH_4$ gas, the reattachment of atomic silicon can be prevented, and slicing can be attained while maintaining a good sliced surface.

When a wafer having a diameter of, for example, 300 mm is sliced, the processing speed should be 1 mm/sec, supposing that the processing time per wafer is 5 minutes. In such a case, as for the supply amount of the hydrogen gas, $H_2$ supply of 0.33 SLM (Standard Liter per minute) is required at most. In this case, if the optical system causes no loss, the average laser output may be about 60 W. The aforementioned $H_2$ is diluted to a concentration of 0.1 to 10% with Ar, made into radicals by using a catalyst such as Ni and Pt in order to increase the reactivity with the atomic Si, and then supplied into the processing atmosphere.

In this case, in order to prolong the lifetime of the radicals as long as possible, it is desirable that the hydrogen should be supplied as radicals with dilution to a concentration of 10% or less, more preferably 0.1 to 5%. If the hydrogen is supplied at a high concentration, the generation ratio of the radicals is reduced. However, in such a case, the generation ratio can be improved by heating a site where the catalyst exists. If the processing is performed with a processing speed of 1 mm/sec, the discharge velocity of the atomic Si (gas) from a processing surface reaches about 1.7 m/sec. Therefore, if H radicals are sprayed to the vicinity of a portion under slicing, the released Si rapidly becomes $SiH_4$ gas and discharged outside the wafer, and thus deposition of Si on the walls of the apparatus can be prevented. Further, the reaction product, $SiH_4$, which is generated for 0.17 SLM in this case, can be collected and reused.

Further, since the wafer slicing processing according to the present invention is a non-contact type slicing method utilizing an ultra short pulse laser, a wafer to be sliced can be made to have an extremely smaller thickness compared with conventional mechanical slicing process utilizing a wire saw or the like. For example, when a single crystal wafer is sliced from semiconductor silicon, a wafer having a diameter of 200 mm must be sliced with a thickness of about 700 to 800 μm in the conventional techniques. However, the single crystal wafer according to the present invention can be made thinner than the above, and for example, a wafer having a diameter of 200 mm can be sliced with a thickness of 600 μm or less. Therefore, this smaller thickness, together with the smaller stock removal for the slicing, markedly increase the number of wafers that can be produced from one single crystal ingot, and thus it becomes possible to reduce the production cost.

In addition, the wafer slicing processing of the present invention enables processing with flatness of atomic order without wafer plane orientation dependency by the irradiation of hydrogen radicals. Further, since a technique for forming an insulator film of good quality irrespective of the plane orientation of silicon wafer surface was recently developed as-described above, it is unnecessary to limit the plane orientation of wafer for the production of semiconductor devices to the conventional {100} plane. Therefore, in the slicing of thin wafer according to the present invention, if a wafer is sliced so that the wafer should have a plane orientation tilting with respect to all the {110} planes, at which cleavage is likely to occur, for the wafer surface, a wafer unlikely to break due to external stress and having a small thickness can be produced.

Figure 4:
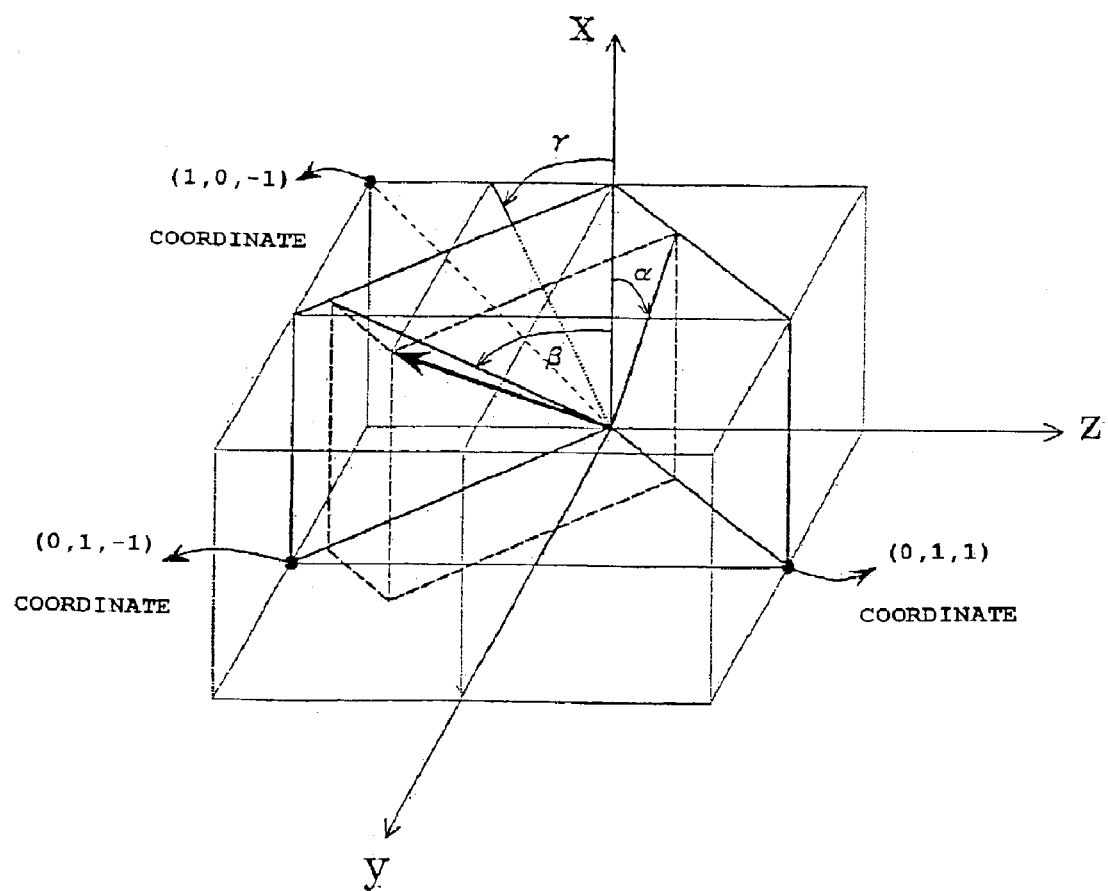
FIG. 4 is an explanatory diagram for explaining preferred plane orientation of a single crystal wafer to be sliced by the method of the present invention.

FIG. 4 is an explanatory diagram for explaining preferred plane orientation of a single crystal wafer to be sliced by the method of the present invention. The arrowhead (vector) represented by the bold line in FIG. 4 indicates the plane orientation of the single crystal wafer to be sliced (direction of the normal of the wafer surface). It has, with respect to the [100] axis (X-axis), tilting angles of α (0°<α<90°) for the [011] direction, β (0°<β<90°) for the [01-1] direction and γ (0°≦γ<45°) for the [10-1] direction.

That is, a single crystal wafer having this plane orientation will have a plane tilting by angles of α, β and γ from the cleavage planes, (011) plane, (01-1) plane and (10-1) plane, respectively, and thus mechanical strength of the wafer with respect to an external stress is increased, and the wafer can be made more unlikely to break even with a smaller thickness, compared with a wafer having {100} plane.

The present invention is not limited to the embodiments described above. The above-described embodiments are mere examples, and those having the substantially same structure as that described in the appended claims and those providing similar functions and advantages are all included in the scope of the present invention.

For example, in the aforementioned embodiments, a gas containing hydrogen radicals is supplied in the vicinity of a portion under slicing, and thus the wafer surface is completely terminated with hydrogen. However, if such termination is not necessarily required, the same effect can be obtained by using an addition gas of $Cl_2$, $BCl_3$, $NF_3$ or the like. Further, the single crystal to be processed is of course not limited to a Si single crystal, and for example, GaAs, GaP, InP, various oxide single crystals, quartz and so forth can be similarly processed by suitably selecting a gas to be supplied to a portion under slicing ($H_2$, $CCl_4$, $CH_3Br$, HCl etc.).

What is claimed is:

1. A method for slicing a single crystal, wherein the single crystal is sliced by irradiating a portion to be sliced with an ultra short pulse laser beam while supplying a gas containing hydrogen radicals that react with atoms constituting the single crystal to become stable gaseous molecules in the vicinity of the portion under slicing.

2. The method for slicing a single crystal according to claim 1, wherein the ultra short pulse laser beam is an excimer laser.

3. The method for slicing a single crystal according to claim 1, wherein the ultra short pulse laser is a mode-locking type Q-switched laser.

4. The method for slicing a single crystal according to claim 2, wherein the ultra short pulse laser is a mode-locking type Q-switched laser.

5. The method for slicing a single crystal according to claim 1, wherein concentration of the hydrogen radicals in the gas is 10% or less.

6. The method for slicing a single crystal according to claim 1, wherein the single crystal is a silicon.

7. The method for slicing a single crystal according to claim 6, wherein the single crystal wafer is sliced from the single crystal so that the single crystal wafer should satisfy a relationship of thickness of single crystal wafer (μm)/diameter of single crystal wafer (mm)≦3.

8. The method for slicing a single crystal according to claim 7, wherein the single crystal wafer is sliced from the single crystals so that the main surface of the single crystal wafer has a plane or a plane equivalent to a plane tilting with respect to a [100] axis of the single crystal by angles of α (0°<α<90°) for the [011] direction, for β (0°<β<90°) the [01-1] direction and γ (0°≦γ<450°) for the [10-1] or [101] direction.

9. The method for slicing a single crystal according to claim 6, wherein the single crystal wafer is sliced from the single crystal so that the main surface of the single crystal wafer has a plane or a plane equivalent to a plane tilting with respect to a [100] axis of the single crystal by angles of α (0°<α<90°) for the [011] direction, β (0°<β<90°) for the [01-1] direction and γ (0°≦γ<45°) for the [10-1] or [101] direction.

10. The method for slicing a single crystal according to claim 1, wherein stock removal for slicing is 5 μm or less.

11. The method for slicing a single crystal according to claim 10, wherein the single crystal wafer is sliced from the single crystal so that the single crystal wafer should satisfy a relationship of thickness of single crystal wafer ($\mu$m)/diameter of single crystal wafer (mm)≦3.

12. The method for slicing a single crystal according to claim 1, wherein the single crystal wafer is sliced from the single crystal so that the main surface of the single crystal wafer has a plane or a plane equivalent to a plane tilting with respect to a [100] axis of the single crystal by angles of $\alpha$ (0°<$\alpha$<90°) for the [011] direction, $\beta$ (0°<$\beta$<90°) for the [01-1] direction and $\gamma$ (0°≦$\gamma$<45°) for the [10-1] or [101] direction.

\* \* \* \* \*